United States Patent [19]

McKelvey

[11] 4,417,968

[45] Nov. 29, 1983

[54] MAGNETRON CATHODE SPUTTERING APPARATUS

[75] Inventor: Harold E. McKelvey, Plymouth, Mich.

[73] Assignee: Shatterproof Glass Corporation, Detroit, Mich.

[21] Appl. No.: 477,069

[22] Filed: Mar. 21, 1983

[51] Int. Cl.$^3$ .............................................. C23C 15/00
[52] U.S. Cl. ............................ 204/192 R; 204/192 C; 204/298
[58] Field of Search ................ 204/298, 192 C, 192 R

[56] References Cited

U.S. PATENT DOCUMENTS 3,901,784  8/1975  Quinn et al. ..................... 204/192 C
4,356,073 10/1982  McKelvey ....................... 204/192 R Primary Examiner—Arthur P. Demers
Attorney, Agent, or Firm—William E. Nobbe

[57] ABSTRACT

A cylindrical magnetron cathode sputtering apparatus for the simultaneous coating of a large number of articles or substrates, comprising an evacuable coating chamber, a central cylindrical cathode mounted in said coating chamber and a plurality of auxiliary cylindrical cathodes also mounted in said coating chamber circumferentially of said central cathode, magnet assemblies mounted in said central cathode and in each of said auxiliary cathodes, with means being provided for rotating each of said cathodes while maintaining the magnet assemblies therein stationery. A carrier for holding the articles to be coated is located between the central cathode auxiliary cathodes and includes a plurality of article supports arranged circumferentially of the central cathode, said article supports being rotatable as well as being caused to revolve around the central cathode in planetary fashion.

15 Claims, 5 Drawing Figures

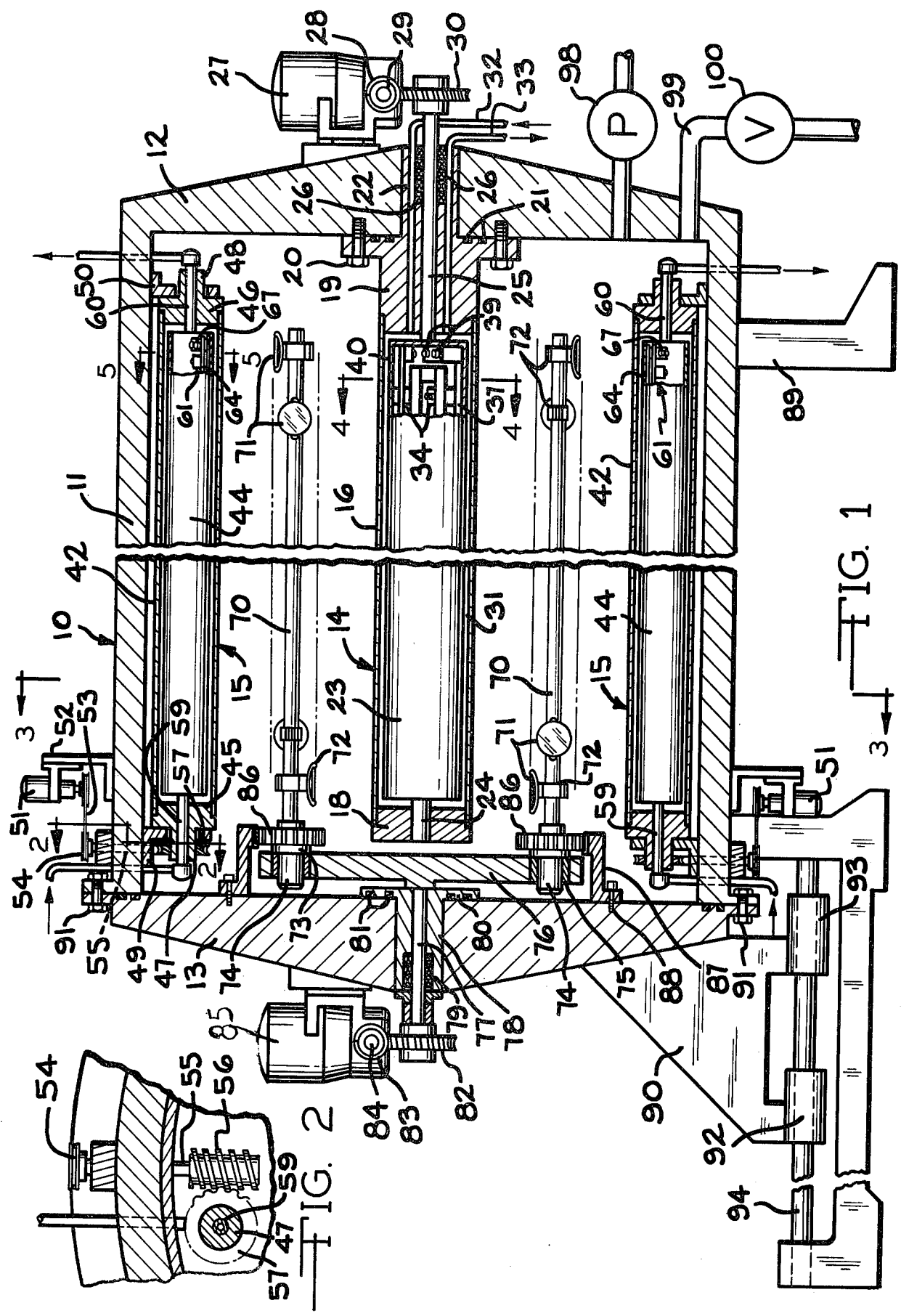

MAGNETRON CATHODE SPUTTERING APPARATUS

SUMMARY OF THE INVENTION

The present invention relates broadly to apparatus for cathode sputtering and more particularly to an improved magnetron cathode sputtering apparatus.

This invention contemplates the provision of a magnetron cathode sputtering system which allows the simultaneous coating of a large number or batch of articles or substrates.

According to the invention, the system embodies an evacuable coating chamber in which is mounted a central cylindrical cathode and a plurality of auxiliary cylindrical cathodes disposed concentrically around the central cathode. Each of said cathodes comprises an elongated tubular target member to the outer surface of which is applied the coating material to be sputtered. Magnet assemblies are mounted in each of said cathodes for enhancing the performance thereof and a cooling medium is circulated through the cathodes. Each of the cathodes is also rotated, while the magnet assemblies therein remain stationery. An article or substrate carrier is mounted between the central cathode and auxiliary cathodes and is caused to revolve around the central cathode in planetary fashion, while the articles or substrates carried by said carrier are simultaneously rotated whereby to present all surfaces or areas of the articles or substrates to be coated to the coating material sputtered from the cathodes.

These and other features and advantages of the invention will become apparent from the following description, with reference to the accompanying drawings.

BRIEF DESCRIPTION OF THE DRAWINGS

FIG. 1 is a vertical longitudinal section of sputtering apparatus constructed in accordance with the present invention, FIG. 2 is a detail section taken substantially along line 2—2 of FIG. 1.

DESCRIPTION OF THE PREFERRED EMBODIMENT

Figure 3:
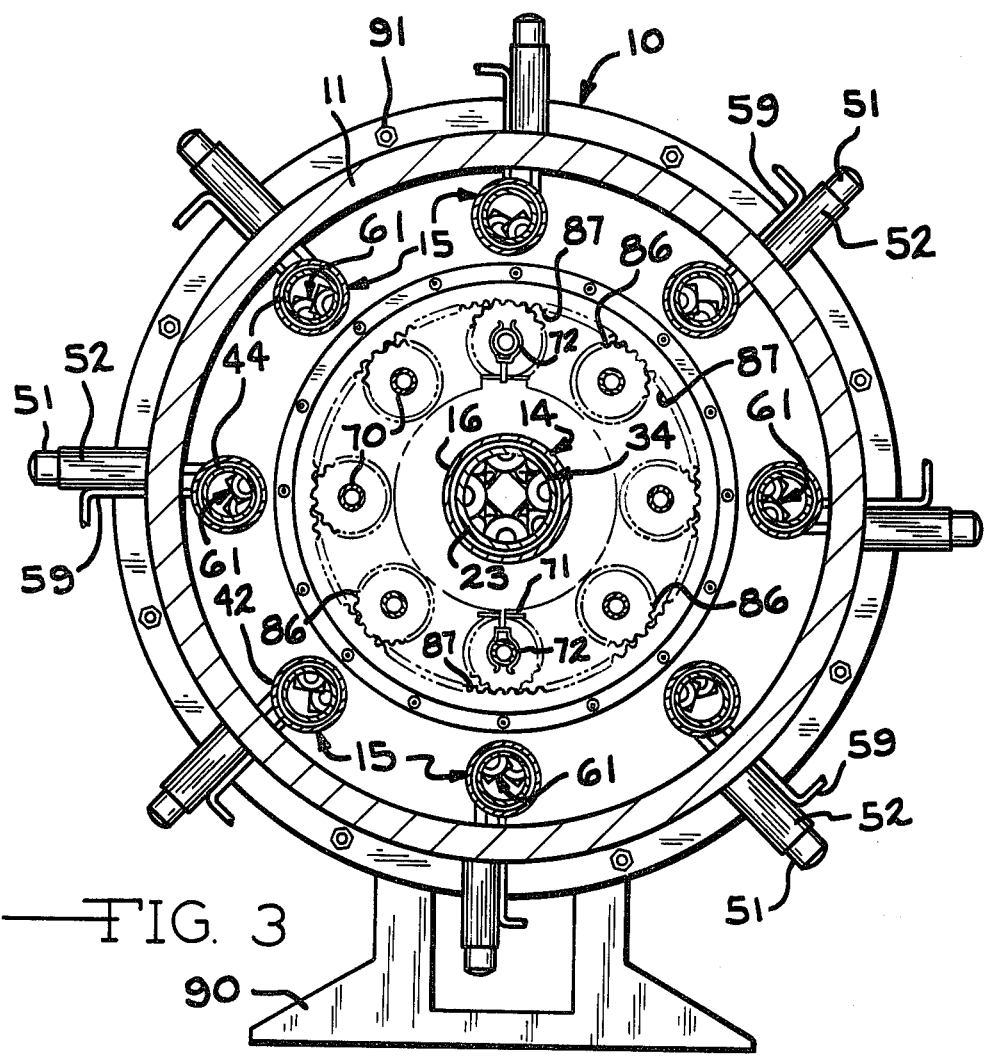
FIG. 3 is a transverse section through the apparatus taken substantially along line 3—3 of FIG. 1.

With reference to the drawings, there is provided an evacuable coating chamber 10 composed of an elongated cylindrical wall 11 closed at its opposite ends by the end walls 12 and 13.

Mounted centrally within the coating chamber 10 and extending longitudinally thereof is a central cylindrical cathode 14. A plurality of auxiliary cylindrical cathodes 15 are also mounted in said coating chamber and are equidistantly positioned around said central cathode 14 in spaced parallel relation thereto.

Figures 4, 5:
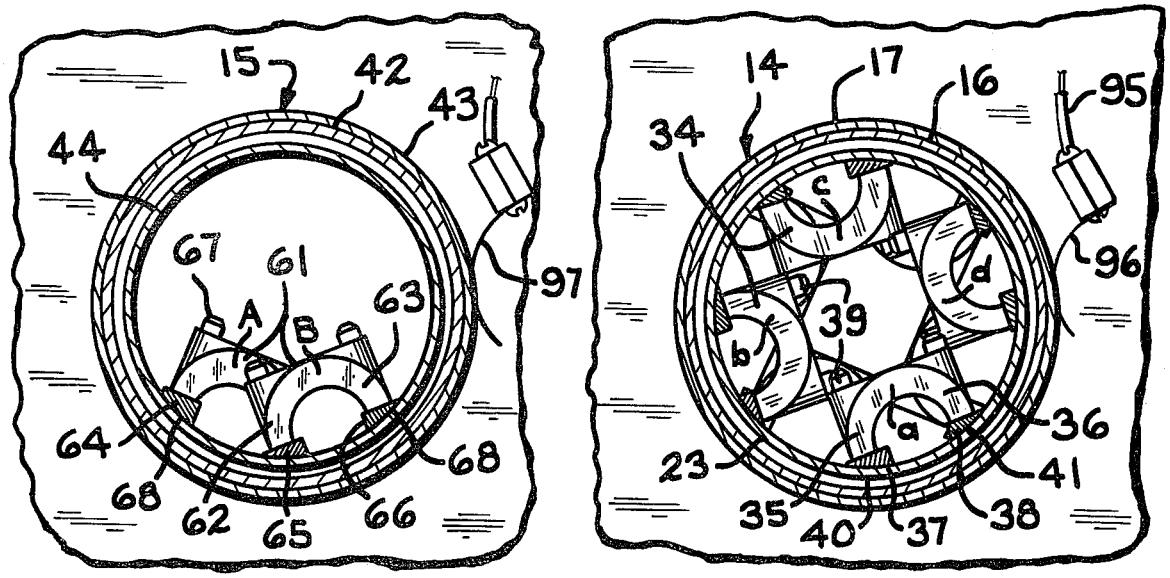
FIG. 4 is a transverse section through the central cathode taken substantially along line 4—4 of FIG. 1.
FIG. 5 is a transverse section through one of the auxiliary cathodes taken substantially along line 5—5 of FIG. 1.

The central cathode 14 comprises an elongated tubular target member 16 having a layer 17 of the coating material to be sputtered applied to the outer surface thereof (FIG. 4). The tubular member 16 is closed at one end by a cap 18 and is secured at its opposite end to a bearing bracket 19 fastened to the end wall 12 by screws 20. O-rings or the like 21 are provided between the meeting faces of the bearing bracket 19 and end wall 12. The bearing bracket 19 is provided with a neck portion 22 which passes through an opening in the end wall 12.

Mounted within the tubular target member 16 in spaced concentric relation thereto is a second tubular member 23 supported at one end by a trunnion 24 rotatably received in the cap 18 and at its opposite end by a shaft 25 which extends through the bearing bracket 19 and end wall 12 and is surrounded by a seal 26. The inner tubular member 23 is driven from a motor 27 carried by end wall 12 through a gear 28 keyed to the motor shaft 29 and meshing with a gear 30 keyed to the end of shaft 25.

The central cathode 14 is adapted to be internally cooled by circulating a cooling medium, such as water, through the space 31 between the inner tubular member 23 and the outer target member 16. Thus, the cooling medium may be introduced through a pipe 32 extending through the bearing bracket 19 and exit through a pipe 33.

The central cathode 14 is a magnetron cathode and to this end there is mounted within the inner tubular member 23 a magnet assembly consisting of an array of permanent U-shaped magnets 34. As shown in FIG. 4, the magnets are arranged in four rows a, b, c and equally spaced around the inner circumference of the tubular member 23 and extending lengthwise thereof. The legs 35 and 36 of the magnets in each row are secured to magnetic 37 and 38 respectively by screws 39. The outer surfaces 40 and 41 of the strips 37 and 38 that contact the inner surface of the tubular member 23 are shaped to conform to the curvature thereof. The provision of the magnets enhances the performance of the cathode by increasing the sputter deposition rate.

Each of the auxiliary cathodes 15 surrounding the central cathode 14 also includes an elongated cylindrical target member 42 having a layer of the coating material 43 to be sputtered applied to the outer surface thereof (FIG. 5). Mounted within the tubular member 42 in spaced parallel relation thereto is an inner tubular member 44. The tubular target member 42 is secured at one end to a bearing member 45 and at its opposite end to a similar bearing member 46. The bearing members 45 and 46 are provided with extensions 47 and 48 respectively that are rotatably mounted in bearing brackets 49 and 50 respectively secured to the cylindrical wall 11 of the coating chamber.

The tubular target member 42 of auxiliary cathode 15 is driven from a motor 51 carried by bracket 52 secured to the cylindrical wall 11 of the coating chamber. More specifically, the motor 51 drives a belt 53 which, in turn, drives a pulley 54 keyed to the outer end of a shaft 55 passing through the cylindrical wall 11 and having keyed thereto a worm 56 meshing with worm gear 57 fixed to the extension 47 of bearing member 45.

Each of the auxiliary cathodes 15 is also adapted to be internally cooled by circulating a cooling medium, such as water, therethrough, said cooling medium being introduced into one end of the cathode through a pipe 59 and exiting at the opposite end through a pipe 60 passing through the bearing members 45 and 46 respectively.

The auxiliary cathodes 15 are also magnetron cathodes and to this end there is mounted in the tubular member 44 of each said cathode a magnet assembly consisting of an array of permanent U-shaped magnets 61 (FIG. 5). The magnets 61 are arranged in two rows A and B extending lengthwise of the tubular member. The magnets 61 in each row are aligned with one another, with the magnets in one row being disposed alternately with and overlapping the magnets in the other row. The legs 62 and 63 of the magnets engage and are secured to magnetic strips 64, 65 and 66 by screws 67. Here also, the outer surfaces 68 of the magnetic strips that engage the inner surface of the tubular member 44 are shaped to conform to the curvature thereof.

The articles or substrates to be sputter-coated are carried by a rotatable carrier that comprises a plurality of rods 70 on which the articles 71 are held by clamps or the like 72. One end of each rod 70 is unsupported, while the other end is provided with a collar 73 having a reduced end portion 74 rotatably received in a bushing 75 in a circular carrier plate 76. The article support rods 70 extend in spaced parallel relation with the cathodes 14 and 15 and are equidistantly spaced from one another.

The circular carrier plate 76 is supported axially by a shaft 77 that extends through a bushing 78 in end wall 13 and is surrounded by a seal 79. The bushing 78 is provided with an annular flange 80 inwardly of the end wall 13 and positioned between said flange and end wall are O-rings 81 or other sealing means.

The shaft 77 projects beyond the bushinh 78 and has keyed thereto a gear 82 meshing with a gear 83 keyed to the shaft 84 of motor 85 carried by end wall 13 for rotating the shaft 77 and hence the carrier plate 76.

Keyed to the end of each article support rod 70 adjacent the carrier plate 76 is a gear 86 meshing with a planetary gear 87 secured to the end wall 13 by screws 88. Upon operation of the motor 85 the carrier plate 76 will be rotated to revolve the support rods 70 around the central cathode 14 in planetary fashion, while the support rods themselves will be simultaneously rotated about their axes by rotation of the gears 86 as they travel around the planetary gear 87. In this way, the articles or substrates to be coated will be both rotated and revolved around the central cathode 14 in such manner as to expose all surfaces or areas to the coated to the coating material sputtered from the cathodes 14 and 15. At this time, the central cathode and auxiliary cathodes will also be rotated.

The coating chamber 10 is mounted upon floor supports 89 and 90. The end wall 13 of the coating chamber is removably secured to the cylindrical wall 11 by bolts 91 and the support 90 is provided with sleeves 92 and 93 that slide along guide rods 94 which allows the end wall to be moved outwardly upon removal of the bolts 91 to permit access to the interior of the coating chamber for charging or discharging of the articles being processed.

A cathode potential sufficient to cause sputtering to occur is supplied to the target material 17 of the central cathode 14 from a D.C. power source (not shown) through a power line 95 secured to a contact 96 having sliding engagement with said target material (FIG. 4). A similar electrical sliding contact 97 may be associated with each auxiliary cathode 15 (FIG. 5).

A vacuum pump 98 is provided to evacuate the coating chamber 10 to the desired pressure. Should it be desired to inject gasses into the chamber it may be done through conduit 99 controlled by a valve 100.

While there has been illustrated and described herein a preferred embodiment of the invention, it will be understood that changes and modifications may be made without departing from the spirit of the invention or scope of the claims.

I claim:

1. A magnetron cathode sputtering apparatus, comprising an evacuable coating chamber, a central cylindrical cathode mounted in said chamber, a plurality of auxiliary cylindrical cathodes also mounted in said chamber in surrounding relation to and parallel with said central cathode, means for rotating said central cathode and each of said auxiliary cathodes, a rotatable carrier for the articles to be coated positioned between said central cathode and said auxiliary cathodes, means for revolving said article carrier around said central cathode, and means for simultaneously rotating the articles carried by said carrier.

2. A magnetron cathode sputtering apparatus as claimed in claim 1, in which said article carrier includes a plurality of article support elements spaced around said central cathode, and including means for rotating said article support elements as the carrier revolves around said central cathode.

3. A magnetron cathode sputtering apparatus as claimed in claim 2, in which said article carrier includes a rotatable carrier plate, in which the article support elements are rotatably carried by said carrier plate, and including means for rotating said carrier plate to revolve the article support elements around said central cathode, and means for simultaneously rotating said article support elements.

4. A magnetron cathode sputtering apparatus as claimed in claim 1, including means for internally cooling said central cathode and each of said auxiliary cathodes.

5. A magnetron cathode sputtering apparatus as claimed in claim 3, in which the means for simultaneously rotating the article support elements comprises a gear keyed to each of said support elements, and a planetary gear carried by the coating chamber and with which the gears of the article support elements mesh and about which they rotate as said elements revolve around said central cathode.

6. A magnetron cathode sputtering apparatus as claimed in claim 5, in which said article support elements comprise a plurality of rods carried at one end by said carrier plate and rotatable relative thereto, said rods being arranged around the central cathode in spaced, parallel relation thereto.

7. A magnetron cathode sputtering apparatus as claimed in claim 5, including means for circulating a cooling medium through said central cathode and each of said auxiliary cathodes.

8. A magnetron cathode sputtering apparatus as claimed in claim 1, including a magnet assembly mounted in said central cathode and in each of said auxiliary cathodes.

9. A magnetron cathode sputtering apparatus as claimed in claim 8, in which each of said magnet assemblies comprises an array of permanent magnets arranged in rows extending lengthwise of the cathode.

10. A magnetron cathode sputtering apparatus as claimed in claim 9, in which said magnets are permanent U-shaped magnets.

11. A magnetron cathode sputtering apparatus, comprising an evacuable coating chamber, a central cylindrical cathode mounted in said chamber, a plurality of auxiliary cylindrical cathodes also mounted in said chamber in surrounding relation to and parallel with said central cathode, said central cathode and each of said auxiliary cathodes comprising a rotatable tubular target member having a layer of the coating material to be sputtered applied to the outer surface thereof and an inner tubular member mounted in spaced relation to the outer target member, a magnet assembly mounted in the inner tubular member of the central cathode and in each of the auxiliary cathodes, and means for rotating the target members of said central cathode and each auxiliary cathode relative to the respective magnet assembly mounted therein.

12. A magnetron cathode sputtering apparatus as claimed in claim 11, including a carrier plate, a plurality of article support elements rotatably supported by said carrier plate, and means for rotating said carrier plate to revolve the article support elements around the central carrier.

13. A magnetron cathode sputtering apparatus as claimed in claim 12, including means for simultaneously rotating said article support elements.

14. A magnetron cathode sputtering apparatus as claimed in claim 13, in which said article suport elements comprise rods rotatably supported at one end by said carrier plate, and in which the means for rotating said article support rods includes a gear keyed to each rod, and a planetary gear secured to the coating chamber and with which said gears mesh and along which they travel upon rotation of said carrier plate.

15. A method of sputter-coating a plurality of articles simultaneously, comprising providing a central elongated cylindrical magnetron cathode and a plurality of auxiliary elongated cylindrical magnetron cathodes in surrounding relation to said central cathode in an evacuable coating chamber, rotating each of said cathodes about its longitudinal axis, supporting a plurality of articles to be coated between said central cathode and said auxiliary cathodes and in spaced relation thereto, rotating said articles, and simultaneously revolving said articles in planetary fashion around said central cathode and past said auxiliary cathodes.

* * * * *